US006489084B1

(12) United States Patent
Pidwerbecki et al.

(10) Patent No.: US 6,489,084 B1
(45) Date of Patent: Dec. 3, 2002

(54) FINE DETAIL PHOTORESIST BARRIER

(75) Inventors: David Pidwerbecki, Corvallis, OR (US); Gerald T. Kraus, Albany, OR (US); Paul J. Benning, Albany, OR (US); Diana D. Granger, Corvallis, OR (US); Joe E. Stout, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 128 days.

(21) Appl. No.: 09/664,484

(22) Filed: Sep. 18, 2000

Related U.S. Application Data

(62) Division of application No. 09/121,258, filed on Jul. 22, 1998, now Pat. No. 6,161,923.

(51) Int. Cl.[7] .............................. B41J 2/01; G03F 7/00

(52) U.S. Cl. ......................... 430/320; 430/396; 347/65; 347/93

(58) Field of Search ................................ 430/320, 396; 347/65, 93, 63, 54

(56) References Cited

U.S. PATENT DOCUMENTS

| | | | | |
|---|---|---|---|---|
| 4,809,428 A | | 3/1989 | Aden et al. | 29/611 |
| 5,198,834 A | | 3/1993 | Childers et al. | 346/1.1 |
| 5,388,326 A | | 2/1995 | Beeson et al. | 29/611 |
| 5,420,627 A | | 5/1995 | Keefe et al. | 347/87 |
| 5,463,413 A | | 10/1995 | Ho et al. | 347/65 |
| 5,519,423 A | | 5/1996 | Moritz, III et al. | 347/65 |
| 5,594,481 A | | 1/1997 | Keefe et al. | 347/65 |
| 5,666,143 A | | 9/1997 | Burke et al. | 347/65 |
| 5,686,224 A | * | 11/1997 | O'Neill | 430/320 |
| 5,734,399 A | | 3/1998 | Weber et al. | 347/65 |
| 6,043,000 A | * | 3/2000 | Park et al. | 430/318 |

FOREIGN PATENT DOCUMENTS

EP 0691206 A2 1/1996

OTHER PUBLICATIONS

Buskirk, et al, "Development of a High–Resolution Thermal Inkjet Printhead", Oct. 1998, Hewlett–Packard Journal, pp. 55–61.

Askeland, et al, "The Second–Generation Thermal Inkjet Structure", Aug. 1988, Hewlett–Packard Jpurnal, pp. 28–31.

* cited by examiner

*Primary Examiner*—John A. McPherson
(74) *Attorney, Agent, or Firm*—Raymond A. Jenski

(57) ABSTRACT

The photoresist barrier layer of an inkjet printer printhead is processed to enable channels narrower than a predetermined width in the barrier layer to be created without blockage. Relatively large volumes of photoresist which form a wall of the channel are exposed to a partial exposure of electromagnetic radiation to yield a reduced concentration of photoresist barrier layer in the large volume.

10 Claims, 10 Drawing Sheets

SECTION B-B

SECTION B-B

FINE DETAIL PHOTORESIST BARRIER

CROSS REFERENCE TO RELATED APPLICATION(S)

This is a divisional of application Ser. No. 09/121,258 filed on Jul. 22, 1998, now U.S. Pat. No. 6,161,923.

BACKGROUND OF THE INVENTION

The present invention is generally related to a photoresist barrier layer capable of reproducing fine details and more particularly related to a barrier layer in an inkjet printer printhead that utilizes small dimensions to produce reduced drop weight ink drops.

Inkjet printers operate by expelling a small volume of ink through a plurality of small orifices in an orifice plate held in proximity to a medium upon which printing or recording marks are to be placed. These orifices are arranged in a fashion in the orifice plate such that the expulsion of drops of ink from a selected number of orifices relative to a particular position of the medium results in the production of a portion of a desired character or image. Controlled repositioning of the orifice plate or the medium followed by another expulsion of ink drops results in the creation of more segments of the desired character or image. Furthermore, inks of various colors may be coupled to individual arrangements of orifices so that selected firing of the orifices can produce a multicolored image by the inkjet printer.

Several mechanisms have been employed to create the force necessary to expel an ink drop from a printhead, among which are thermal, piezoelectric, and electrostatic mechanisms. While the following specification is made with reference to a thermal ink ejection mechanism, the present invention may have application for the other ink ejection mechanisms as well.

Expulsion of the ink drop in a conventional thermal inkjet printer is a result of rapid thermal heating of the ink to a temperature that exceeds the boiling point of the ink vehicle to create a vapor phase bubble of ink. Such rapid heating of the ink is generally achieved by passing a pulse of electric current through an ink ejector that usually is an individually addressable heater resistor, typically for 1 to 3 microseconds, and the heat generated thereby is coupled to a small volume of ink held in an enclosed area associated with the heater resistor and that is generally referred to as a firing chamber. For a printhead, there are a plurality of heater resistors and associated firing chambers—perhaps numbering in the hundreds—each of which can be uniquely addressed and caused to eject ink upon command by the printer. The heater resistors are deposited in a semiconductor substrate and are electrically connected to external circuitry by way of metalization deposited on the semiconductor substrate. Further, the heater resistors and metalization may be protected from chemical attack and mechanical abrasion by one or more layers of passivation. Additional description of basic printhead structure may be found in "The Second-Generation Thermal InkJet Structure" by Ronald Askeland et al. in The Hewlett-Packard Journal, August 1988, pp. 28–31. Thus, one of the walls of each firing chamber consists of the semiconductor substrate (and typically one firing resistor). Another of the walls of the firing chamber, disposed opposite the semiconductor substrate in one common implementation, is formed by the orifice plate. Generally, each of the orifices in this orifice plate is arranged in relation to a heater resistor in a manner that enables ink to be expelled from the orifice. As the ink vapor bubble nucleates at the surface of the heater resistor and expands, it displaces a volume of ink that forces a volume of ink out of the orifice for deposition on the medium. The bubble then collapses and the displaced volume of ink is replenished from a larger ink reservoir by way of an ink feed channel in another of the walls of the firing chamber.

As users of inkjet printers have begun to desire finer detail in the printed output from a printer—especially in color output—the technology has been pushed into smaller drops of ink to achieve the finer detail. Smaller ink drops means lowered drop weight and lowered drop volume. Production of such low drop weight ink drops requires smaller structures in the printhead. Thus, smaller firing chambers (containing a smaller volume of ink), smaller ink ejectors, and smaller orifice bore diameters are required.

A majority of the size of the firing chamber is determined by a layer of photoimagable polymer sandwiched between the heater resistor-bearing semiconductor substrate and the orifice plate. This layer is traditionally known as a barrier layer and has often been described, see for example, "Development of High-Resolution Thermal Inkjet Printhead", by William A. Buskirk, et al., the Hewlett-Packard Journal, October 1988, pp. 55–61. The barrier layer is honeycombed with cavities that, when bounded by the substrate on one side and by the orifice plate on the other, become the ink firing chambers and connecting inkfeed channels that route ink into the ink firing chambers. The dimensions and architecture of the ink firing chambers, the ink feed channels, and other features which control and filter ink are typically defined and created by photoimaging techniques. These techniques are capable of creating relatively small features in the barrier material.

A problem that occasionally manifest itself in inkjet printheads is that of occlusion or narrowing occurring in an ink feed channel or in the orifice of the printhead. Microscopic particles can become lodged in the channel leading to the ink firing chamber, causing premature failure of the heater resistor, misdirection of ink drops, or diminished ink supply to the firing chamber resulting in greatly diminished ink drop size. A single orifice, which does not fire an ink drop when it is commanded to do so, leaves a missing portion from a printed character or creates a band of missing drops from a printed image. The end result is perceived as a poorer quality of printed matter, a highly undesirable characteristic for an inkjet printer. To resolve this undesirable result, others have used spare or redundant orifices to eject ink, multiple inlets to the ink firing chamber, and pillars or islands formed in the barrier layer and disposed in the ink path to filter particles from the ink.

As the size of the firing chamber, ink feed channels, and filtering features become smaller—for example approximately the same dimensions as the thickness of the barrier layer—the conventional barrier layer photoimaging process is unable to resolve the finer details of the desired architecture. This inability places a limitation on the smallest size of the architectural features and will limit the reliability of the ejection of ink when the smallest features are not properly formed.

SUMMARY OF THE INVENTION

An inkjet printhead having fine details in a barrier layer includes a photoresist layered to a predetermined thickness on a substrate. A first volume a second volume, and a third volume of the photoresist are selected to remain after development of the photoresist. When the first volume and the second volume are spaced apart by a distance less than a predetermined distance, the first volume is exposed to less than a full exposure of electromagnetic radiation. The third volume of the photoresist is exposed to a full exposure of electromagnetic radiation. The exposed photoresist is then developed.

DETAILED DESCRIPTION OF A PREFERRED EMBODIMENT

The present invention encompasses photoresist details that are added to the architecture-defining features of the photoresist so that the resolution of the details of the features is enhanced. As previously indicated, this improvement in resolution, or fine detail definability, has particular application in an inkjet printhead, but may be equally well used in other applications such as printed circuit board electrical trace definition.

Figure 1:
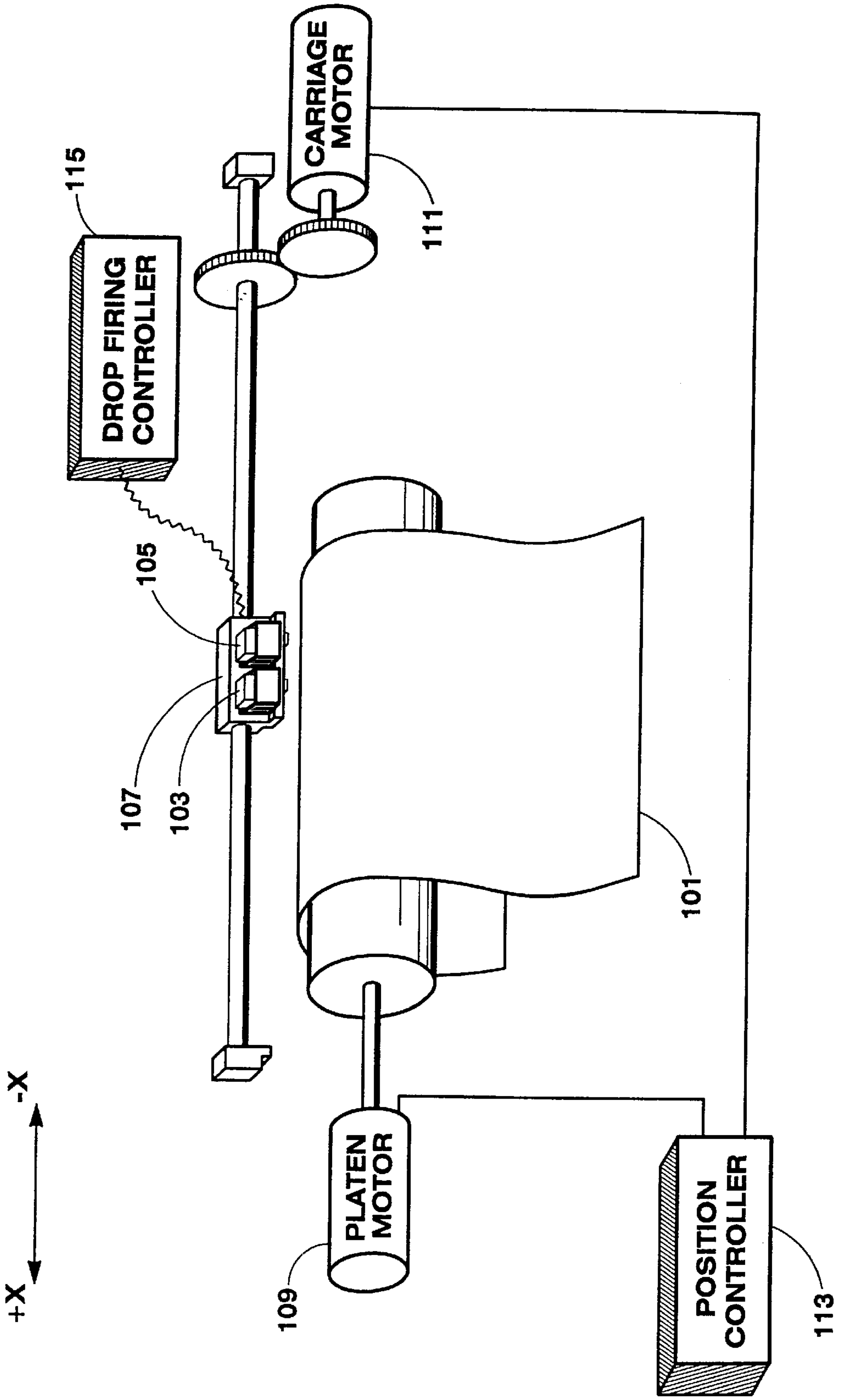
FIG. 1 is a simplified diagram of a printer which may employ the present invention.

A simplified diagram of an inkjet printer which may use the present invention is shown in FIG. 1. A medium to be printed upon 101 is moved past one or more print cartridges 103 and 105 in a direction out of the plane of the figure of FIG. 1 by a platen motor 109. Two print cartridges are shown for generality but it is recognized that a particular printer may employ only a single print cartridge (for example, for black ink printing) or many print cartridges (for example, for multicolor printing). The print cartridges 103 and 105 are mounted in a cartridge carrier 107 and are scanned in conventional fashion back and forth across the medium 101 in an orthogonal, or scan, direction by a carriage motor 111. The platen motor 109 and the carriage motor 111 are typically under the control of a media and cartridge position controller 113. An example of such positioning and control apparatus may be found described in U.S. Pat. No. 5,070,410. Thus, the medium 101 is positioned in a location so that the print cartridges 103 and 105 may eject droplets of ink as required by the data that is input to a drop firing controller 115 of the printer in a band parallel to the scan direction as the print cartridges 103 and 105 are translated across the medium by the carriage motor 111. When the print cartridge 103 and 105 reach the end of their travel at an edge of the medium 101, the medium is typically incrementally advanced by a media position controller 113 and the platen motor 109, and the print cartridges 103 and 105 are returned along the "X" axis.

Figure 2:
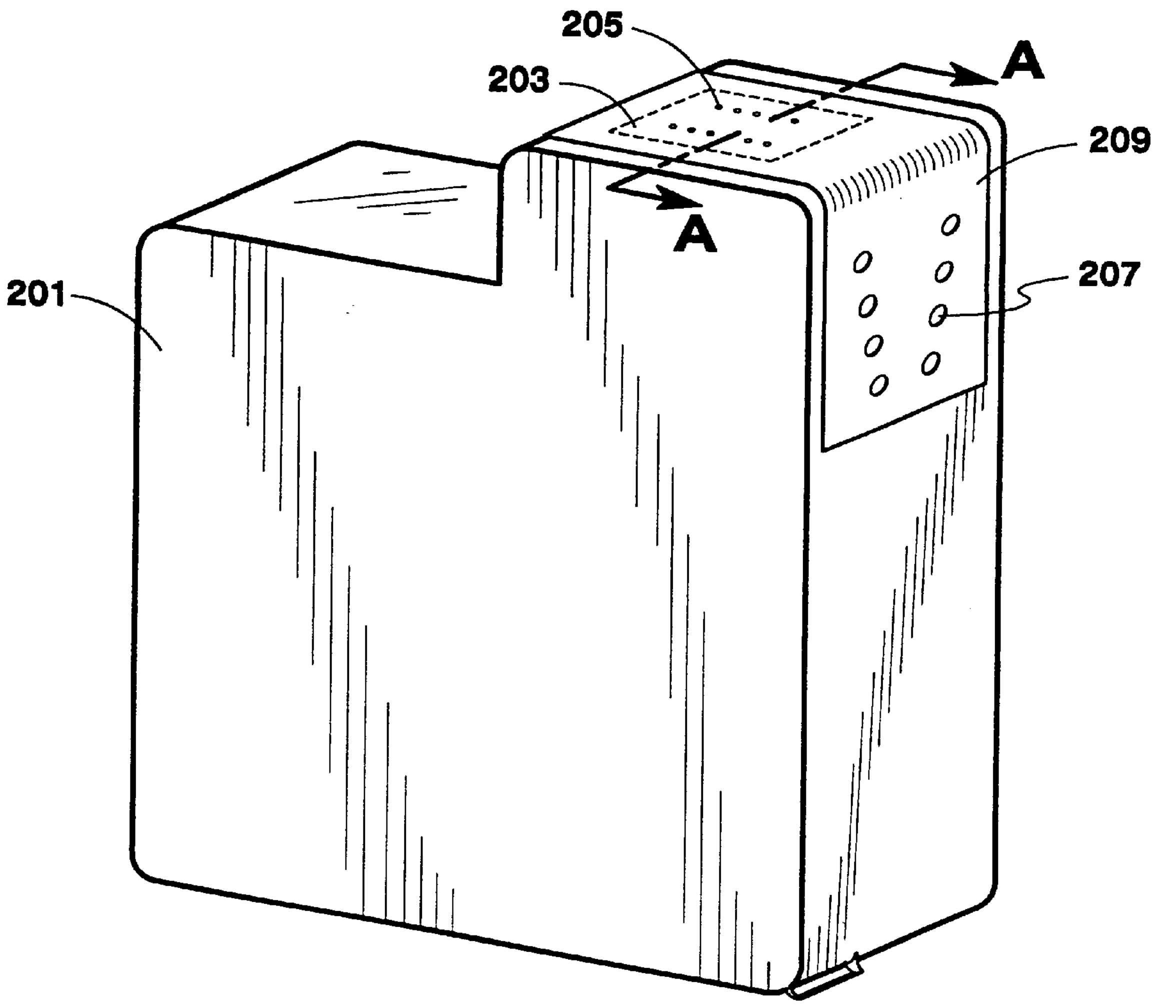
FIG. 2 is an isometric view of a print cartridge which may be used in the printer of FIG. 1 and which may employ the present invention.

An example of an inkjet cartridge that mechanically mounts in the cartridge carrier 107 and is electrically coupled to the drop firing controller 115 of the inkjet printer is shown in FIG. 2. A cartridge body housing 201 houses a supply of ink and routes the ink to a printhead 203 via ink conduits. Visible at the outer surface of the printhead are a plurality of orifices 205 through which ink is selectively expelled upon commands of the printer drop firing controller, which commands are communicated to the printhead 203 through electrical connections 207 and associated conductive traces (not shown). In one implementation of an inkjet print cartridge, the printhead is constructed from a semiconductor substrate, including thin film heater resistors disposed on or in the substrate, the photoresist barrier layer, and the foraminous orifice plate with, for example, orifice 205. Electrical connections are typically made to the printhead 203 of the print cartridge by way of a flexible polymer tape 209. Copper or other conductive traces are deposited or otherwise secured on one side of the tape so that electrical interconnections 207 can be contacted with the printer and routed to the substrate. The tape can be bent around an edge of the print cartridge, as shown, and secured.

Figure 3:
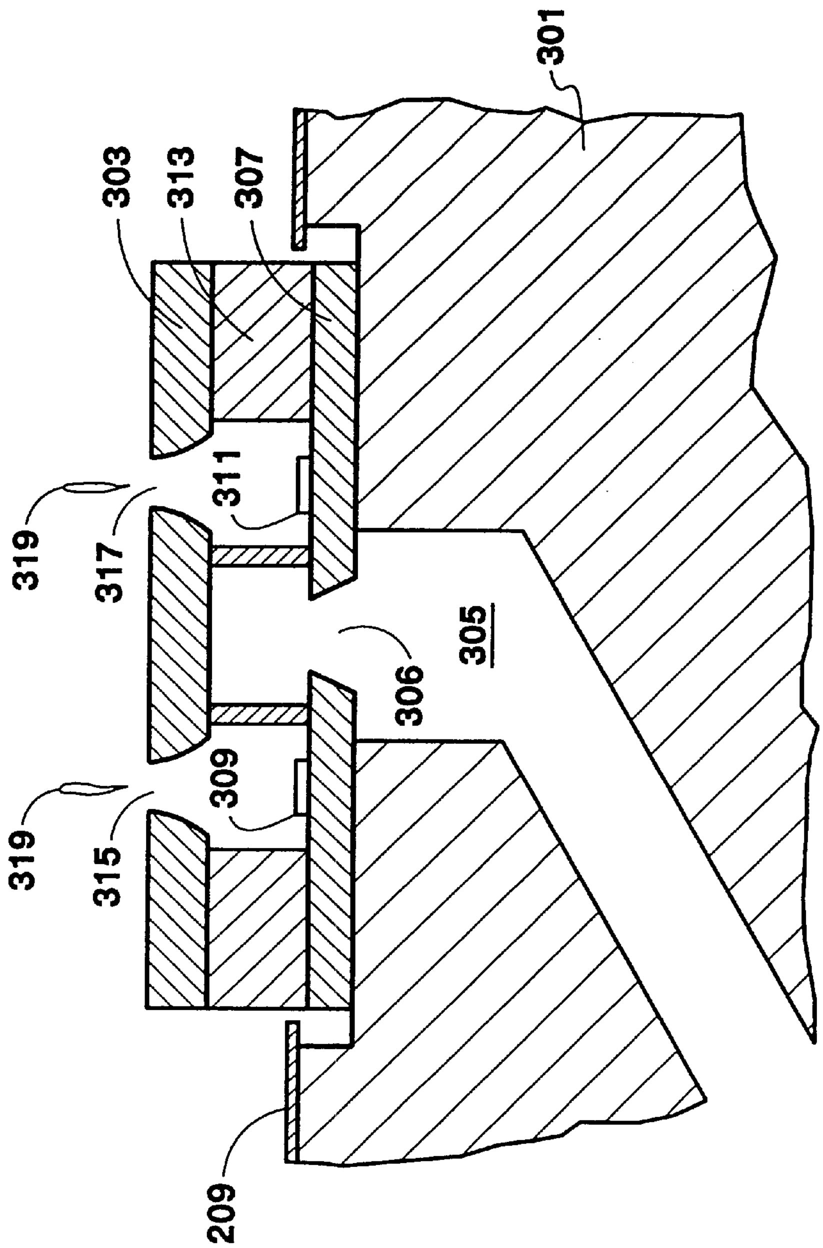
FIG. 3 is a cross sectional elevation view of the printhead illustrating, in particular, ink ejection chambers and which may be employed in the inkjet print cartridge of FIG. 2. This cross section is taken at A—A of FIG. 2.

A cross section of the printhead is shown in FIG. 3 and is taken from part of the section A—A shown in FIG. 2. A portion of the body 301 of the cartridge body housing 201 is shown where it is secured to the printhead by an adhesive (in association with pressure). In the preferred embodiment, ink is supplied to the printhead by way of a common ink plenum 305 and through a slot 306 in the printhead substrate 307. (Alternatively, the ink may be supplied along the sides of the substrate). Heater resistors and their associated orifices are conventionally arranged in two essentially parallel rows near the inlet of ink from the ink plenum. In many instances the heater resistors and orifices are arranged in a staggered configuration in each row and, in the preferred embodiment, the heater resistors are located on opposite sides of the slot 306 of the substrate 307, as exemplified by heater resistors 309 and 311 in FIG. 3.

The orifice plate 303 in the preferred embodiment is produced by electrodepositing nickel on a mandrel having pegs and dikes with appropriate dimensions and suitable draft angles in the form of a complement of the features desired in the orifice plate. Upon completion of a predetermined amount of time in an electrodeposition bath, a thickness of nickel will be deposited on the mandrel. The resultant nickel film is removed after cooling and mechanically planarized and treated for subsequent use. The nickel orifice plate is then conventionally coated with a precious metal such as gold, paladium, or rhodium to resist corrosion. Following its fabrication, the orifice plate is affixed to the semiconductor substrate 307 with the barrier layer 313, which also functions as an adhesive. The orifices created by the electrodeposition on the mandrel extend from the outside surface of the orifice plate 209 through the material to the inside surface, the surface that forms one of the walls of the ink firing chamber. Usually, an orifice is aligned directly over the heater resistor so that ink may be expelled from the orifice without a trajectory error introduced by an offset.

The substrate 307 and orifice plate 303 are affixed together by the barrier layer material 313. In the preferred embodiment, the barrier layer material 313 is disposed on the substrate 307 in a patterned formation such that firing chambers 315 and 317 are created in areas around the heater resistors. The barrier layer material is also patterned so that ink is supplied independently to the firing chambers by one or more ink feed channels. Ink drops 319 are selectively ejected upon the rapid heating of a heater resistor upon command by the printer. The substrate having the barrier layer affixed to one surface is then positioned with respect to the orifice plate such that the orifices are precisely aligned with the heater resistors of the substrate.

The barrier layer 313, in the preferred embodiment, utilizes a negative dry film photoresist in which polymethyl methacrylate (PMMA) or similar materials that are polymerized in a free radical reaction and withstand relatively aggressive fluids like ink. Examples may be found in European Patent Application No. EP 0 691 206 A2 "Ink Jet Printhead Photoresist Layer Having Improved Adhesion Characteristics" published Jan. 10, 1996. In the preferred embodiment, the barrier layer is first applied as a continuous layer upon the substrate 307 with the application of sufficient pressure and heat suitable for the particular material selected. Generally, the barrier layer film is sandwiched between thin protective sheets of material prior to its use in a printhead. One sheet is removed to enable lamination of the barrier layer to the substrate. The other sheet is left in place until after the barrier layer is exposed. The photoresist barrier layer is exposed through a negative mask to ultraviolet light (preferably in the range of wavelengths of 440–340 nm, I-line) to polymerize the barrier layer material. The protective film sheet is removed and the exposed barrier layer, in the preferred embodiment, is subjected to a chemical wash using a developer solvent of a 74:26 w/w % mixture of N-methyl-2-pyrrolidone and diethylene glycol so that the unexposed areas of the barrier layer are removed by dissolution. The external walls of the remaining areas of barrier layer form the walls of each ink firing chamber around each heater resistor. Also, the remaining areas of barrier layer form the walls of ink feed channels that lead from the ink firing chamber to a source of ink (such as the ink plenum 305 by way of the slot as shown in FIG. 3) as well as filtering features in the ink path. The ink feed channels enable the initial fill of the ink firing chamber with ink and provide a continuous refill of the firing chamber after each expulsion of ink from the chamber. The rate at which ink can enter and fill the ink firing chamber is a significant factor in determining the highest speed at which the printer can print. In the preferred embodiment, two ink feed channels are created in the barrier layer to couple the ink plenum to the ink firing chamber so that a redundant supply of ink is maintained to the chamber and that a high rate of refill can be realized.

Figure 4:
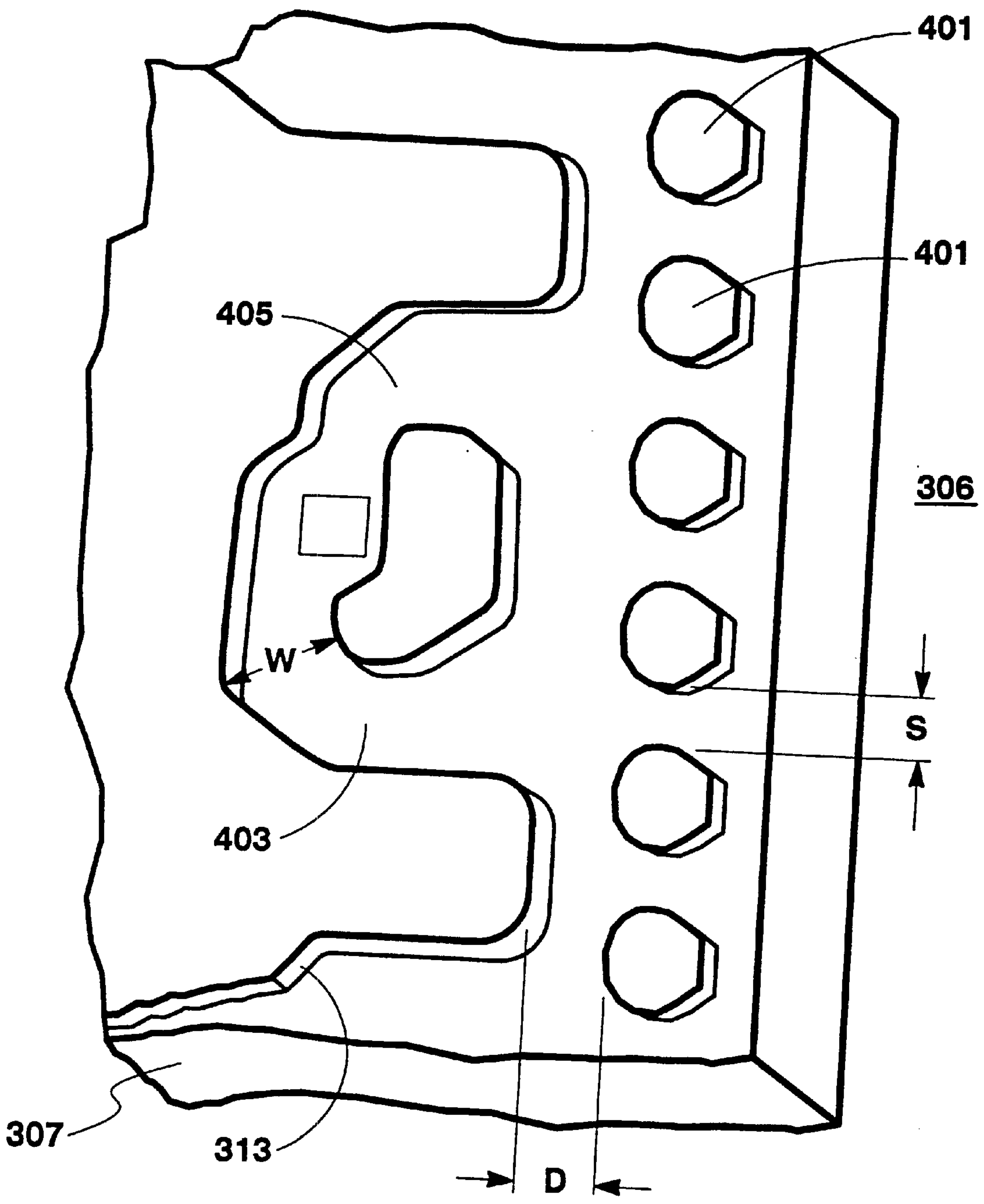
FIG. 4 is an isometric plan view of the barrier layer and substrate of a printhead which may employ the present invention.

One additional feature is created in the barrier layer of the preferred embodiment. At the entrance to each ink feed channel there is disposed a plurality of outer barrier layer islands 401 such as shown in the isometric plan view of the surface of the substrate (with the orifice plate removed) of FIG. 4. Each outer barrier island is composed of barrier material and extends the full thickness of the barrier layer 313 from the substrate 307 to the orifice plate. In order to avoid delamination of the islands from either the orifice plate or the substrate, each outer barrier island offers an area of adhesion of approximately the square of the barrier thickness to each surface. The major purpose of these outer barrier islands is to prevent particles and contaminants from the ink from reaching the ink feed channels and the orifice of each firing chamber. In order to function properly, this filter requires that the spaces (S) between each island (the equivalent of filter pores) be smaller than the channel width (W) of each firing chamber and smaller than the diameter of the orifice bore. Thus, any contaminant that could lodge in the ink feed channel or in the orifice is blocked from these critical areas. As a result of a number of islands (and spaces between), the blockage of any one of the spaces between the islands does not seriously impede the flow of ink to each ink feed channel and the likelihood of occlusion of an ink firing chamber is considerably reduced.

In the preferred embodiment, the dimensions of many of the elements of the printhead have been made significantly smaller than previously known designs to produce a high quality of ink printing by using small ink drops. The nominal ink drop weight is approximately 10 ng for ejection from an orifice having a bore diameter of 18 μm. In order to achieve an ink firing chamber refill rate supportive of a 15 KHz frequency of operation, two offset ink feed channels 403, 405 are employed to provide redundant ink refill capability. Each ink feed channel has a channel width W of 18.5 μm and a channel length of approximately 30 μm. Channels and orifices of these dimensions present a greater challenge to the filtering of contaminants than previously undertaken in that particles the size of human skin cells will block an ink feed channel or orifice. Since particles of this size include some biological cells that are non-rigid, the filter pore size must be less than the smallest operational dimension of the printhead to trap the potentially blocking particle. Depending upon the particular application, the smallest operational dimension is either the ink feed channel, W, of 18.5 μm or the orifice bore diameter of approximately 18 μm. In the preferred embodiment, the spacing (S) between each island is 12 μm. The thickness, T, of the barrier layer is 14 μm.

Negative photoresists are well-known for resolution limitations primarily due to swelling during the material photo development process. It is known that any feature defined in the barrier layer, or the space between any such feature, should have dimensions that exceed the thickness dimension of the barrier layer. See, Weiss, "Photoresist Technology Update", Semiconductor International, April 1983. Weiss states that negative photoresist materials are limited to layer thickness to feature dimensions of 1:2 or 1:3 ratios while positive resists were capable of 1:1 ratios. The typical procedures for insuring manufacturable designs are to maintain photoresist features exceeding these minimum aspect ratios. If these guidelines are followed, generally, the photoresist features can be resolved, developed, and adherence to the thinfilm structure maintained within the expected manufacturing variation of photoresist material quality and tool variation. In the development of low drop weight ink drop cartridges, however, it was found that the physical limits of being able to resolve features while still adhering to the manufacturability guidelines would not always apply to some features. Specifically, small, fine features in the barrier material that were surrounded by voids of material were easily able to be produced without bridging. Similar features that were not surrounded by voids experienced significant bridging problems.

Figure 5A:
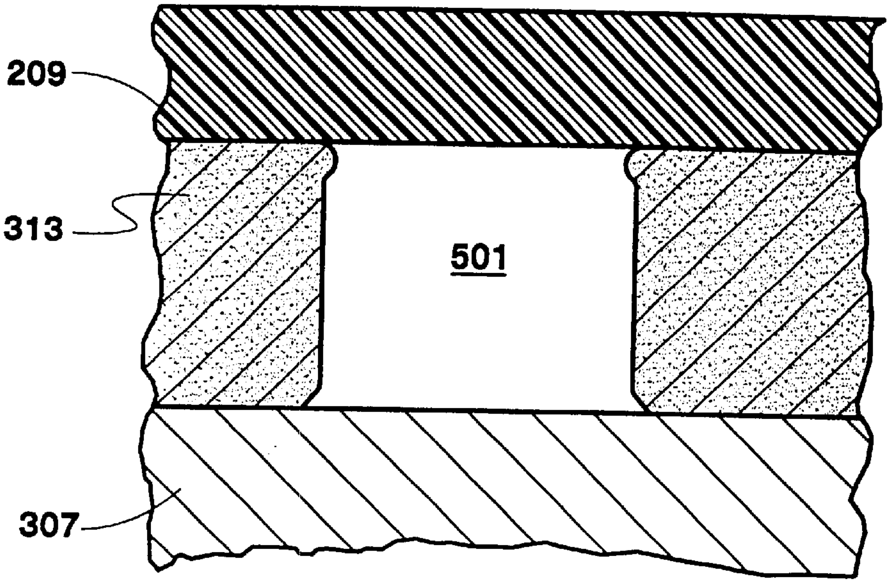
FIGS. 5A and 5B are cross sectional elevation views of an ink feed channel which illustrate the undesirable effect of barrier layer bridging.
Figure 5B:
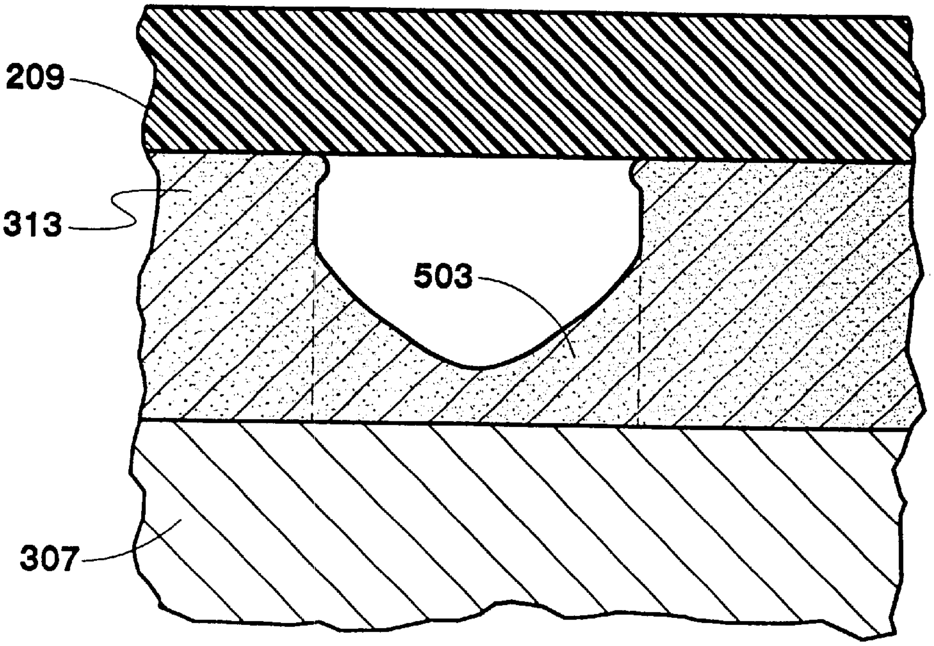

An example of a desired ink feed channel cross section for a low drop weight cartridge is shown in FIG. 5A. The substrate 307 has the barrier layer 313 disposed on its surface. Orifice plate 209 is secured to the barrier layer 313. The barrier layer has had a channel 501 photodefined and developed into the barrier layer so that an ink feed channel has been created by the sandwich of substrate, barrier layer, and orifice plate. Consistent with expectations derived from Weiss, the ink feed channel, having a barrier thickness to feature dimension, W, of 1:1.3, would develop incompletely. This incomplete development results in a bridge 503 of barrier layer remaining across the narrow channel as shown in FIG. 5B. This bridge occludes the channel and reduces the volume of ink flow to the ink firing chamber. Curiously, the spacing between the islands, S, did not exhibit the same bridging even though the barrier thickness to feature dimension, S, was 1:0.9.

It is believed that the depletion of polymerization inhibitor, e.g. oxygen, during exposure limits the feature dimension (channel width) that can be defined between large volumes of negative photoresist. For a given barrier thickness, exposure dose, dose rate, temperature, and oxygen availability at the barrier surface, inhibitor diffusion is believed to be limited to a finite distance. When barrier thickness is such that a channel is defined within this distance, the inhibitor diffusion proximity effect becomes more important than swelling in limiting aspect ratio.

When an area of barrier layer material is exposed to non-ionizing radiation such as ultraviolet (UV) electromagnetic radiation, chemical reactions are induced in the barrier film that form free radicals. These free radicals initiate crosslinking chain reactions that make exposed areas immune to the developer solvent and thus define the desired image; however, in a usual manufacturing environment, molecular oxygen from the air is in equilibrium with the other components in the barrier layer film. Before the cross-linking reactions may ensue, the oxygen molecules—which are much more reactive to free radicals—must first be consumed. Once the concentration of radicals required to react with the immediately-available oxygen and other polymerization inhibitors is exceeded, further radiation cross-links the material.

The proximity effect that caused "incomplete development" (or "bridging") occurs at the interface between the exposed and unexposed volumes of barrier material: the exposed side has been depleted of free oxygen molecules; the unexposed side still has the equilibrium concentration. Thus, because the barrier layer is separated from the oxygen in the air by its protective cover film during manufacture of the printhead, a concentration gradient forces migration of free oxygen molecules into the exposed volume from the adjacent unexposed barrier material in order to equalize the distribution of free molecular oxygen. Oxygen migration out of the unexposed barrier material that will form the ink feed channel then lowers the amount of radiation required to initiate a chain reaction because there are fewer oxygen molecules to consume before the onset of crosslinking, thus allowing the masked channel to be undesirably exposed by radiation scattered from the unmasked area.

An inkjet printhead employing the present invention is able to reliably produce features in negative photoresist that are below the 1:2 ratio limitation defined by Weiss. In a preferred embodiment, the ratio of barrier layer thickness to feature dimension is reliably produced at a ratio of 1:1.3 without bridging even when the feature such as an ink feed channel is proximate a large volume of exposed barrier material. Experiments have indicated that ratios as low as 1:0.9 can be reliably produced. As described above, the ink feed channel of a preferred embodiment (formed by the wall of a large volume of barrier material and the wall of an inner barrier island) has a width, W, of approximately 17 μm using a barrier material with a thickness, T, of approximately 14 μm. That is, when an inner barrier island 605 is spaced apart from a large volume of barrier material 601, 603 to create an ink feed channel 403 or 405, the large volume of barrier material is partially exposed to electromagnetic energy to reduce or eliminate bridging. Further in the preferred embodiment, the outer barrier islands 401 are spaced apart from each other by a distance (S) of approximately 10 μm and spaced apart from the nearest large volume of exposed barrier material by a distance (D) of approximately 20 μm. It should be noted that the dimensions for the barrier layer features are given as the dimensions of the photoresist mask. The spacings between barrier layer walls, spacings such as S, the barrier island spacing, and W, the ink feed channel width, are expected to become between 1 and 2 μm larger than the photoresist mask dimensions after the developing process.

Figure 6:
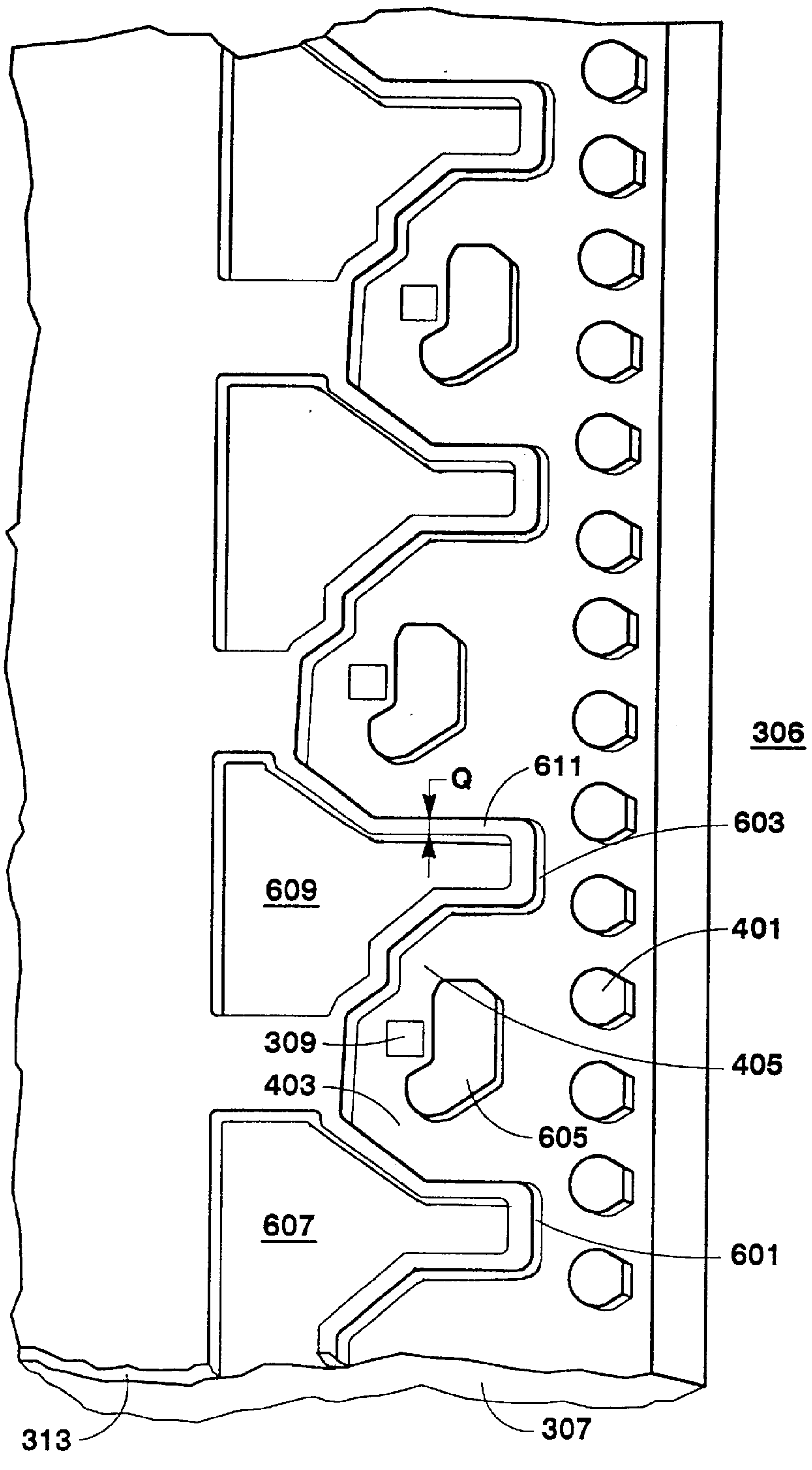
FIG. 6 is an isometric plan view of the barrier layer and substrate of a printhead, illustrating a first alternative embodiment which may employ the present invention.

Several embodiments were created in pursuit of the discovery that fine feature details that were smaller than the design guidelines could be realized in areas where voids in the barrier material were produced (such as the large voids surrounding the outer barrier islands 401 and 403, for example). Two alternative embodiments are disclosed herein that take advantage of the discovery. A first alternative embodiment is shown in FIG. 6. Here, a portion of the printhead substrate and the barrier layer material layered on top of the printhead substrate is shown with the orifice plate removed. A heater resistor 309 is supplied ink from two ink feed channels 403 and 405, which in turn draw ink from an ink feed slot 306 past outer barrier islands 401. Neighboring firing chambers and associated ink firing resistors and ink feed channels are separated by peninsulas 601 and 603 in the barrier layer material. As in previous designs, the ink feed channels 403 and 405 are defined by exterior walls of the barrier material, either as part of the peninsulas 601 and 603 or inner barrier island 605. The ink feed channels, since they are disposed close to the peninsulas and a large mass of barrier material, are subject to the aforementioned bridging and plugging by oxygen-starved barrier material. In the first alternative of the preferred embodiment, voids 607 and 609, for example, are formed in the barrier material leaving a barrier rim wall 611 having a thickness Q. In this embodiment, Q ranges between 2 to 10 microns. The resulting barrier layer in the interior volume of the peninsula areas, in products using the present invention, exhibit a lower overall concentration of photoresist material than solid volumes such as the barrier islands.

Figure 7:
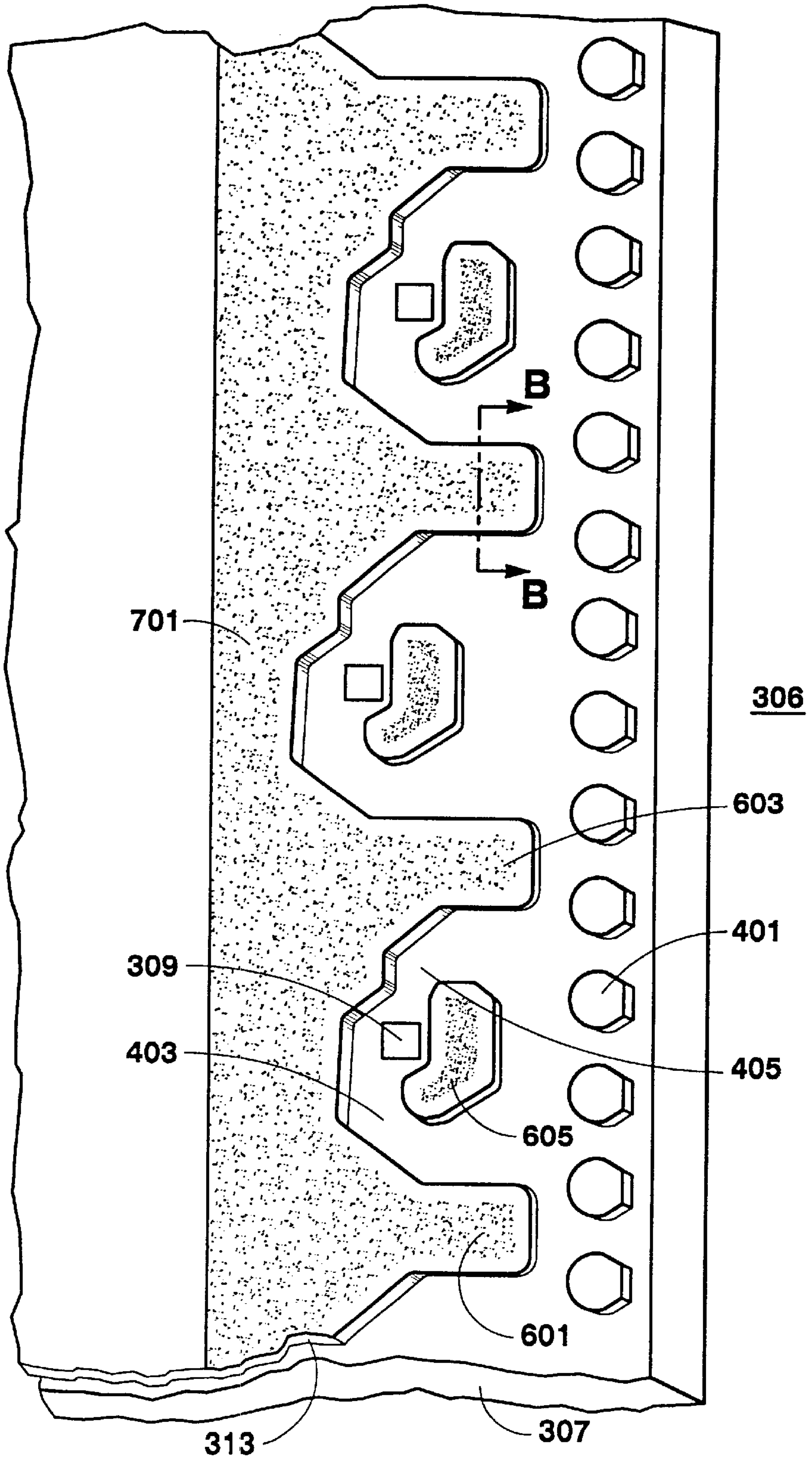
FIG. 7 is an isometric plan view of the barrier layer and substrate of a printhead, illustrating a second alternative embodiment which may employ the present invention.
Figure 8A:
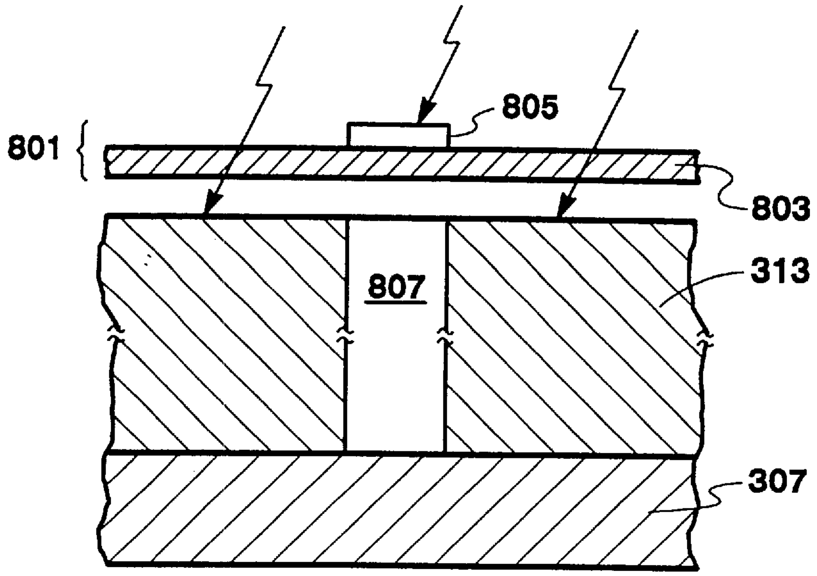
FIGS. 8A and 8B is a greatly enlarged portion of a cross section (for example through B—B of FIG. 7) of a printhead substrate and barrier material during (FIG. 8A) and after (FIG. 8B) exposure to electromagnetic energy.
Figure 8B:
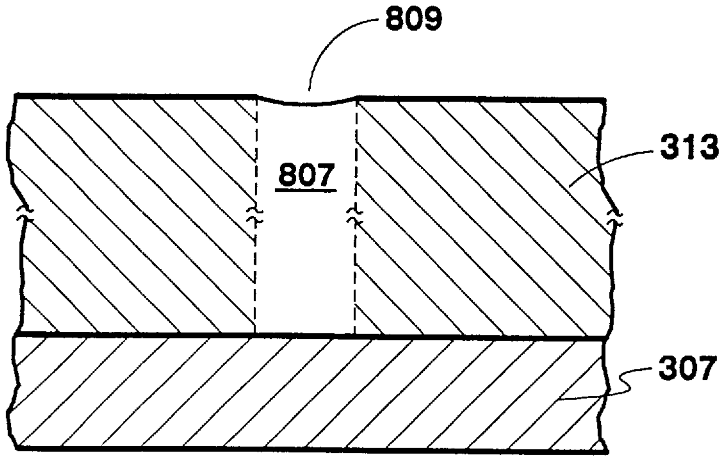

A second alternative embodiment is shown in FIG. 7. Like FIG. 6, FIG. 7 shows a top surface view of the wafer and barrier material with the orifice plate removed. Rather than providing void volumes in select portions of the barrier layer material, a portion 701 of the barrier layer material is subjected to a partial exposure to ultraviolet radiation (rather than a complete masking in a negative photoresist material) so that small volumes of the otherwise masked barrier material can donate oxygen molecules to those volumes that are exposed to the full exposure of ultraviolet electromagnetic radiation (so they will pull fewer molecules from the unexposed ink feed channels 403 and 405). The effect of partial ultraviolet electromagnetic radiation exposure can be appreciated by viewing FIGS. 8A and 8B. A greatly exaggerated cross-sectional view of the substrate 307 and the barrier material 313 is pictured in FIG. 8A. A portion of the barrier material defining mask 801 includes an ultra violet (UV) transparent layer 803 and a chrome UV opaque layer 805. Conventionally, the barrier layer of the peninsulas and other areas that are to be retained after developing are exposed to a full exposure of ultraviolet radiation. In FIG. 8A, certain segments are subdivided from the otherwise exposed area and are prevented from such exposure by the chrome trace 805 of the mask 801. Accordingly, a segment 807 is shadowed by the mask and is unexposed to the ultraviolet radiation. In the preferred embodiment the chrome trace placed on the mask 801 is selected to be a square of approximately 1 to 2 micrometers on a side. In practice, this square produces an oxygen donating area which, because of its size, itself becomes polymerized, thereby leaving only a small pit 809 at the surface of the barrier material. In the second alternative embodiment, the surface of the portion of the barrier material that is selected for the oxygen-donating partial UV exposure takes on the appearance of a shallowly pitted surface with a pseudo-random distribution of pits. This is illustrated in FIG. 7. The interior volumes of those areas partially exposed to electromagnetic radiation, as described above, exhibit a lower concentration of photoresist material (due to the remaining pits) than those areas that are fully exposed. (Once the orifice plate is placed on the barrier material and the barrier material is heated and compressed in order to secure the orifice plate, most of the pits are obliterated by the heat and compression).

Figure 9:
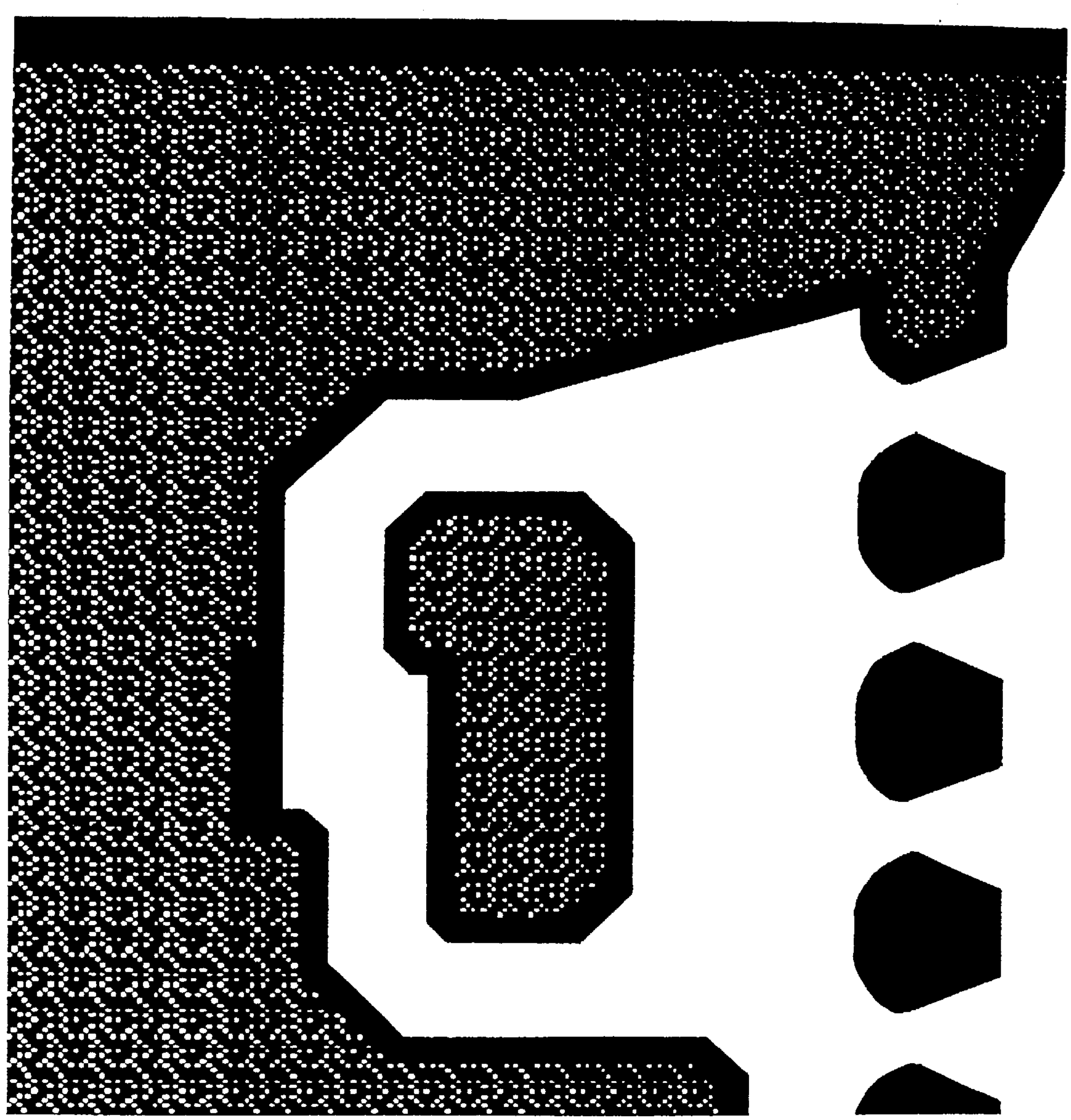
FIG. 9 is an example of a mask which may be employed in the present invention.

A part of the mask that may be employed in producing the structured barrier layer is shown in FIG. 9. The mask shown is for a negative photoresist (black areas indicate no chrome traces) and encompasses a single firing chamber and the two ink feed channels that lead to the firing chamber. This part of the mask is reproduced many times over in a conventional step-and-repeat process so that many firing chambers can be created. In the second alternative embodiment, a large number of chrome squares are disposed in a pseudo-random pattern throughout the exposed regions near the narrow channels in order to provide a partial masking of that portion of the barrier material that is to be a molecular oxygen donor to those areas of the barrier material which will receive full ultraviolet light exposure. The fully exposed areas will draw fewer oxygen molecules from unexposed areas that will be subsequently removed by the development process. The lack of chrome deposition on the mask corresponds to areas of the barrier material that will receive a full exposure of ultraviolet radiation. In the preferred embodiment, between fifteen and fifty percent-preferably twenty-five percent-of the exposure area is shadowed by chrome squares. The pseudo-random pattern is established by first subdividing the portion of the barrier material to be partially exposed into groups of segments, four segments to a group, and selecting one of the four segments to be shadowed by a chrome square. A supergroup of 64 groups have one of the four squares within the group selected for a chrome square on a true random basis. The supergroup is then replicated throughout the portion of the barrier material in order to provide the twenty-five percent masking capability.

Figure 10:
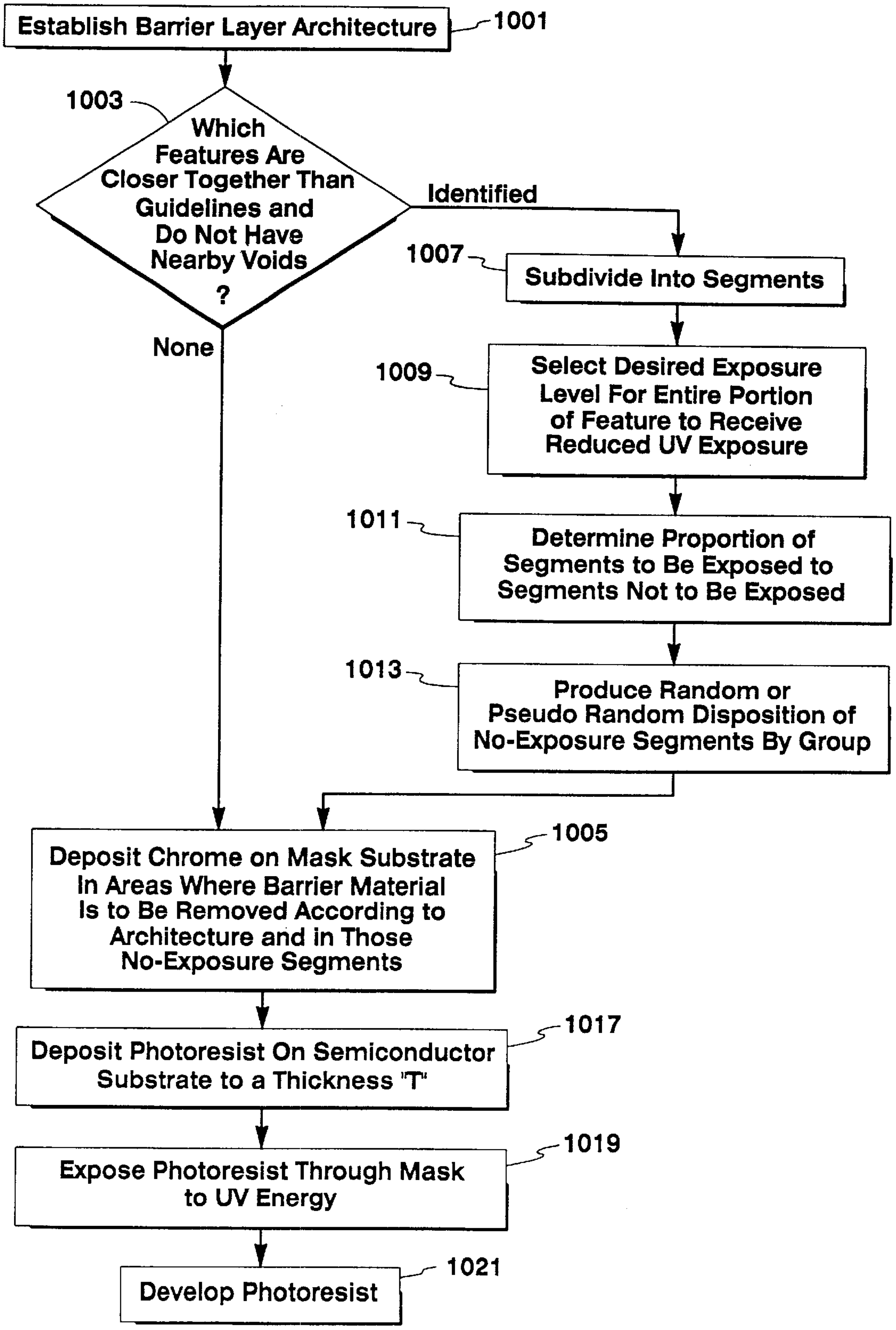
FIG. 10 is a flowchart of the process which may be employed to produce the barrier layer employed in the present invention

The process to produce the improved printhead is shown in FIG. 10. The basic overall architecture of the barrier layer is first established, step 1001, according to the drop volume and other parameters desired for the entire printhead. A determination is then made at 1003 for which features of the barrier layer architecture are disposed closer together than the negative photoresist conventional guidelines and, do not have nearby and necessary voids in the barrier material such as, for example, the outer barrier islands 401. As a result of this step there are two types of features that are defined: those which require full UV exposure and those which require a reduced UV exposure. Since the photoresist in the preferred embodiment is a negative photoresist, this is accomplished by depositing solid chrome on a UV transparent mask (as described above) in areas that are to be shaded from the electromagnetic radiation and depositing a micropattern of chrome and no-chrome in areas that are to receive a reduced electomagnetic radiation exposure. Thus, chrome is deposited (step 1005) on the mask in areas where barrier material is to be removed.

Those areas of barrier material that are selected to be molecular oxygen donors (and receive a reduced exposure to electromagnetic radiation) are subdivided into segments at step 1007. A determination is made regarding the desired amount of ultraviolet radiation exposure the donor portions of the barrier substrate is to receive (in the second alternative embodiment, this level is a seventy-five percent exposure-a twenty-five percent masking). From this determination of the desired exposure level, a proportion of the segments is established, at step 1011, such that the proportion of segments to be exposed relative to those segments not to be exposed is set approximately equal to the desired exposure level of step 1009. When considered in relation to the whole area to receive a reduced exposure, the partial masking of the segments results in a summation or integration of the exposure over the whole reduced exposure area corresponding to the proportion of the unmasked segments to masked segments. Thus, the oxygen molecule donor area is subdivided into a multiplicity of segments. Groups of these segments, for example a group of four contiguous segments, are picked and one of the four segments of the group is randomly masked with the chrome masked material as in step 1013. Chrome is then deposited at the predetermined random or pseudo-random segments in step 1005. A mask thereby results in which the photoresist material is shadowed from ultraviolet electromagnetic radiation and volumes of non-resistant barrier material established.

A semiconductor substrate having the appropriate thin film processing completed to produce the firing resistors, electrical interconnect, and any other required active or passive electronic components is then further processed to add a photoresist material on the same surface of the substrate as the thin film processing. This photoresist is deposited in a conventional manner such as lamination at step 1017. The mask is then aligned and the substrate with the deposited photoresist is subject in step 1019 to I-line ultraviolet electromagnetic radiation. Following exposure, the mask is removed and the photoresist is subjected to a conventional development process such as that described earlier and indicated at block 1021.

We claim:

1. A method for manufacturing an inkjet printhead having fine details in a barrier layer, comprising the steps of:

layering a photoresist to a predetermined thickness on a substrate;

selecting a first volume, a second volume, and a third volume of said photoresist which are to remain after development of said photoresist;

spacing apart said first volume of photoresist and said second volume of photoresist by a distance dimension less than a multiple of 1.5 of said predetermined thickness;

exposing at least a portion of said first volume of photoresist to less than a full exposure of electromagnetic radiation;

exposing said third volume of said photoresist to a full exposure of electromagnetic radiation; and developing said photoresist after said exposing step.

2. A method in accordance with the method of claim 1 wherein said distance dimension is in the range of 13 $\mu$m to 20.5 $\mu$m.

3. A method in accordance with the method of claim 1 further comprising the step of exposing said second volume to less than a full exposure of electromagnetic radiation.

4. A method in accordance with the method of claim 1 wherein said step of exposing said at least a portion of said first volume further comprises the steps of:

subdividing said portion into a multiplicity of segments; and determining a proportion of segments of said multiplicity of segments which are to receive a full exposure of electromagnetic radiation to segments of said multiplicity of segments which are to receive no exposure to electromagnetic radiation whereby said at least a portion of said first volume receives an integrated electromagnetic radiation exposure across said portion corresponding to said proportion.

5. A method in accordance with the method of claim 1 further comprising the steps of identifying a section of said first volume which will be in contact with ink and exposing said identified section to a full exposure of electromagnetic radiation.

6. An inkjet printhead manufactured in accordance with the method of claim 1.

7. A method for creating fine features in a photoresist material comprising the steps of:

producing a mask having a first area transparent to electromagnetic radiation of a predetermined wavelength, a second area opaque to said electromagnetic radiation, and a third area partially opaque to said electromagnetic radiation to define in a photoresist material a first feature spaced apart from a second feature by a distance;

disposing said photoresist material on a substrate to a thickness having a dimension between 0.67 and 1.11 of said distance;

masking said photoresist material with said mask;

exposing said masked photoresist material to said electromagnetic radiation; and developing said photoresist material after said exposure step.

8. A method in accordance with the method of claim 7 wherein said distance is in the range of 13 $\mu$m to 20.5 $\mu$m.

9. A method in accordance with the method of claim 7 wherein said first feature and said second feature are defined by said third area.

10. A method in accordance with the method of claim 9 wherein said first feature comprises a first volume of photoresist material and said second feature comprises a second volume of photoresist, said second volume being less than said first volume.

* * * * *